United States Patent
Chang et al.

(10) Patent No.: US 7,102,871 B2
(45) Date of Patent: Sep. 5, 2006

(54) ELECTROSTATIC CHUCK ASSEMBLY HAVING DISASSEMBLING DEVICE

(75) Inventors: Cheng-Liang Chang, Hsinchu (TW); Ray Chuang, Taipei (TW); Jen Wei, Chia-I (TW); Chian-Kuo Huang, Hsinchu (TW); Huan-Wen Lai, Changhua County (TW); Ching-Sun Lee, Junghe (TW); Cheng-Yua Chuang, Kaohsiung (TW); Chi-Ching Lo, Hsinchu (TW); Neo-Feng Chiou, Taichung County (TW); Yen-Bo Huang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 278 days.

(21) Appl. No.: 10/696,133

(22) Filed: Oct. 29, 2003

(65) Prior Publication Data

US 2005/0094349 A1 May 5, 2005

(51) Int. Cl.
 *H01T 23/00* (2006.01)
(52) U.S. Cl. .................................. 361/234
(58) Field of Classification Search ............... 361/234
 See application file for complete search history.

(56) References Cited

U.S. PATENT DOCUMENTS

| 5,300,175 | A | * | 4/1994 | Gardner et al. | 156/285 |
| 5,874,361 | A | * | 2/1999 | Collins et al. | 438/716 |
| 5,885,428 | A | * | 3/1999 | Kogan | 204/298.15 |
| 6,116,990 | A | * | 9/2000 | Sinclair et al. | 451/259 |

* cited by examiner

*Primary Examiner*—Phuong T. Vu
*Assistant Examiner*—Lucy Thomas
(74) *Attorney, Agent, or Firm*—Thomas, Kayden, Horstemeyer & Risley

(57) ABSTRACT

A disassembling device for separating a pedestal, a ceramic element and a base from an electrostatic chuck assembly. The base has a first end surface and a second end surface. The ceramic element is disposed on the first end surface. The pedestal is disposed on the ceramic element. The disassembling device includes a main body and at least one pushing element. The main body is disposed on the second end surface and has a through hole. The at least one pushing element penetrates the through hole and pushes against the ceramic element and pedestal to separate the ceramic element and pedestal from the first end surface of the base.

16 Claims, 6 Drawing Sheets

ELECTROSTATIC CHUCK ASSEMBLY HAVING DISASSEMBLING DEVICE

BACKGROUND OF THE INVENTION

1. Field of the Invention

The present invention relates to a disassembling device, and in particular to a disassembling device that protects an electrostatic chuck assembly from damage when the electrostatic chuck assembly is disassembled.

2. Description of the Related Art

Generally speaking, when a high density plasma chemical vapor deposition (HDP-CVD) process is performed, a wafer is placed on an electrostatic chuck assembly in a chamber and Silicon Dioxide ($SiO_2$) is deposited thereon.

The electrostatic chuck assembly is mainly comprised of a pedestal, a ceramic element, a base and a cover.

However, the electrostatic chuck assembly is difficult to disassemble. Conventionally, a hammer is employed to separate the pedestal and the ceramic element from the base. Specifically, an operator strikes the ceramic element upwardly from the bottom of the base by means of the hammer to overcome the adhesive bond and separate the pedestal and the ceramic element from the base. The ceramic material, however, is brittle and consequently the ceramic element is easily broken when it is subjected to a blow from the hammer or other striking object. A new ceramic element is needed to replace the broken one. Thus, the manufacturing cost and manpower spent in the deposition process are increased considerably.

Another method is the use of isopropanol (IPA). Even when IPA is employed, the pedestal and ceramic element cannot be easily separated from the base. Instead, a hammer is typically employed to separate the pedestal and the ceramic element from the base. Similar to the previous description, the ceramic element is easily broken by blows from the hammer.

Consequently, there is a need to provide a disassembling device that avoids breakage when separating the pedestal, ceramic element and base from the electrostatic chuck assembly. Such will increase the lifespan of the ceramic element and reduce the wafer manufacturing cost.

SUMMARY OF THE INVENTION

Accordingly, an object of the invention is to provide a disassembling device for separating a pedestal, a ceramic element and a base from an electrostatic chuck assembly. The base has a first end surface and a second end surface. The ceramic element is disposed on the first end surface. The pedestal is disposed on the ceramic clement. The disassembling device comprises a main body and at least one pushing element. The main body is disposed on the second end surface and has a through hole. The at least one pushing element is capable of penetrating the through hole and pushing against the ceramic element and pedestal to gently separate the ceramic element and pedestal from the first end surface of the base.

In one embodiment, the second end surface of the base further comprises at least one threaded hole and the main body further comprises at least one fixing hole. The main body is fixed onto the second end surface of the base by fixing a bolt into the fixing hole and threaded hole.

In one embodiment, the fixing hole is an elongated slot.

In one embodiment, the fixing hole is substantially rectangular.

In one embodiment, the at least one pushing element further comprises a first threaded portion and the through hole of the main body further comprises a second threaded portion. The first threaded portion engages the second threaded portion.

In one embodiment, the at least one pushing element further comprises a first retardant portion adjacent to the first threaded portion and the ceramic element further comprises a first retardant hole. The first retardant portion is engaged in the first retardant hole.

In one embodiment, the first retardant portion of the at least one pushing element is made of Teflon.

In one embodiment, the at least one pushing element further comprises a second retardant portion adjacent to the first retardant portion and the pedestal further comprises a second retardant hole adjacent to the first retardant hole. The second retardant portion penetrates the first retardant hole and is engaged in the second retardant hole.

In one embodiment, the second retardant portion is made of metal.

In one embodiment, the at least one pushing element further comprises a head portion adjacent to the first threaded portion.

Preferably, the first threaded portion, first retardant portion, second retardant portion and head portion of the at least one pushing element are integrally formed.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Before the HDP-CVD process is performed, the chamber is evacuated. The wafer is then placed on the pedestal of the electrostatic chuck assembly and the electrostatic chuck assembly is loaded with a static potential of approximately 950 volts to attract the wafer. $SiH_4$ and oxygen ($O_2$) are introduced into the chamber and react with $SiO_2$ by means of a radio frequency (RF). The $SiO_2$ is further deposited on the surface of the wafer. In addition, the wafer is subjected to high temperature when the $SiO_2$ is deposited on the surface of the wafer. In order to protect the wafer from damage due to high temperature, Helium (He) is passed under the pedestal of the electrostatic chuck assembly to cool the wafer placed thereon.

Figure 1A:
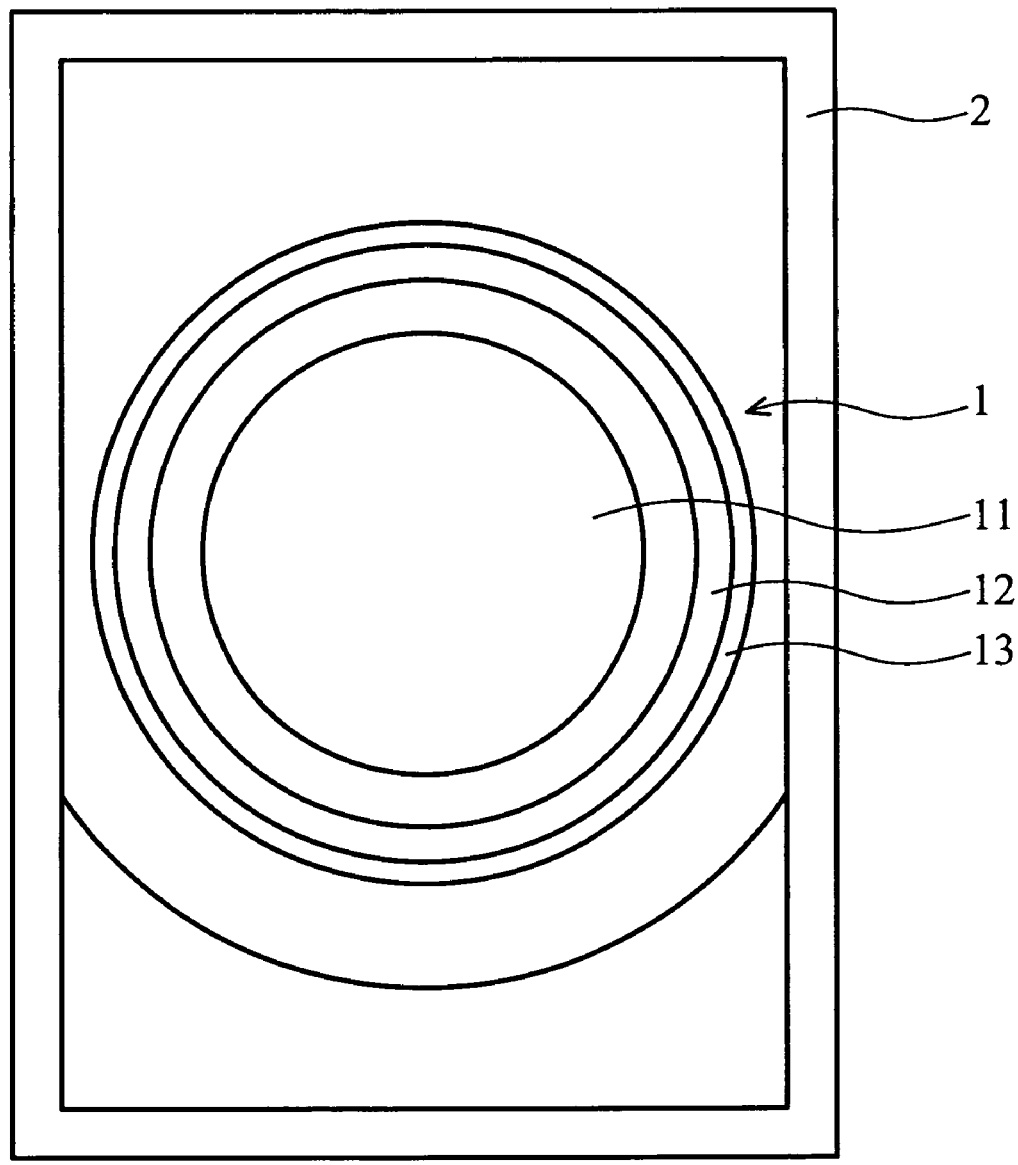
FIG. 1A is a schematic top view showing an electrostatic chuck assembly.

Referring to FIG. 1A, the electrostatic chuck assembly 1 is disposed in a chamber 2 and mainly comprised of a pedestal 11, a ceramic element 12, and a base 13. The pedestal 11 is made of metal and coated with a layer of ceramic material, thus protecting the surface of the wafer from scraping the pedestal 11 when it is placed thereon. The pedestal 11 is concurrently mounted on the ceramic element 12. The base 13 is made of aluminum-based alloy and the ceramic element 12 is mounted thereon. In order to provide a preferable amount of insulation in the interior of the electrostatic chuck assembly 1, and to isolate the interior thereof from the chamber 2, rubber O-rings (not shown) are disposed between the pedestal 11 and ceramic element 12 and between the ceramic element 12 and base 13.

When $SiO_2$ is deposited on the surface of the wafer, $SiO_2$ is also deposited on the electrostatic chuck assembly 1 and in the interior of the chamber 2. Thus, the chamber 2 requires cleaning and maintenance after a predetermined number of wafers are processed. Cleaning and maintenance of the chamber 2 is performed by introducing $NF_3$ into the chamber 2, and the $NF_3$ reacts with another RF to remove $SiO_2$. Although the electrostatic chuck assembly 1 is isolated from the chamber 2 by the O-rings, the $NF_3$ reacts with the rubber O-rings and forms a powder. If the powder is not removed and remains in the chamber 2, it may settle on the surface of the wafer during the deposition process, thereby contaminating the wafer.

Figure 1B:
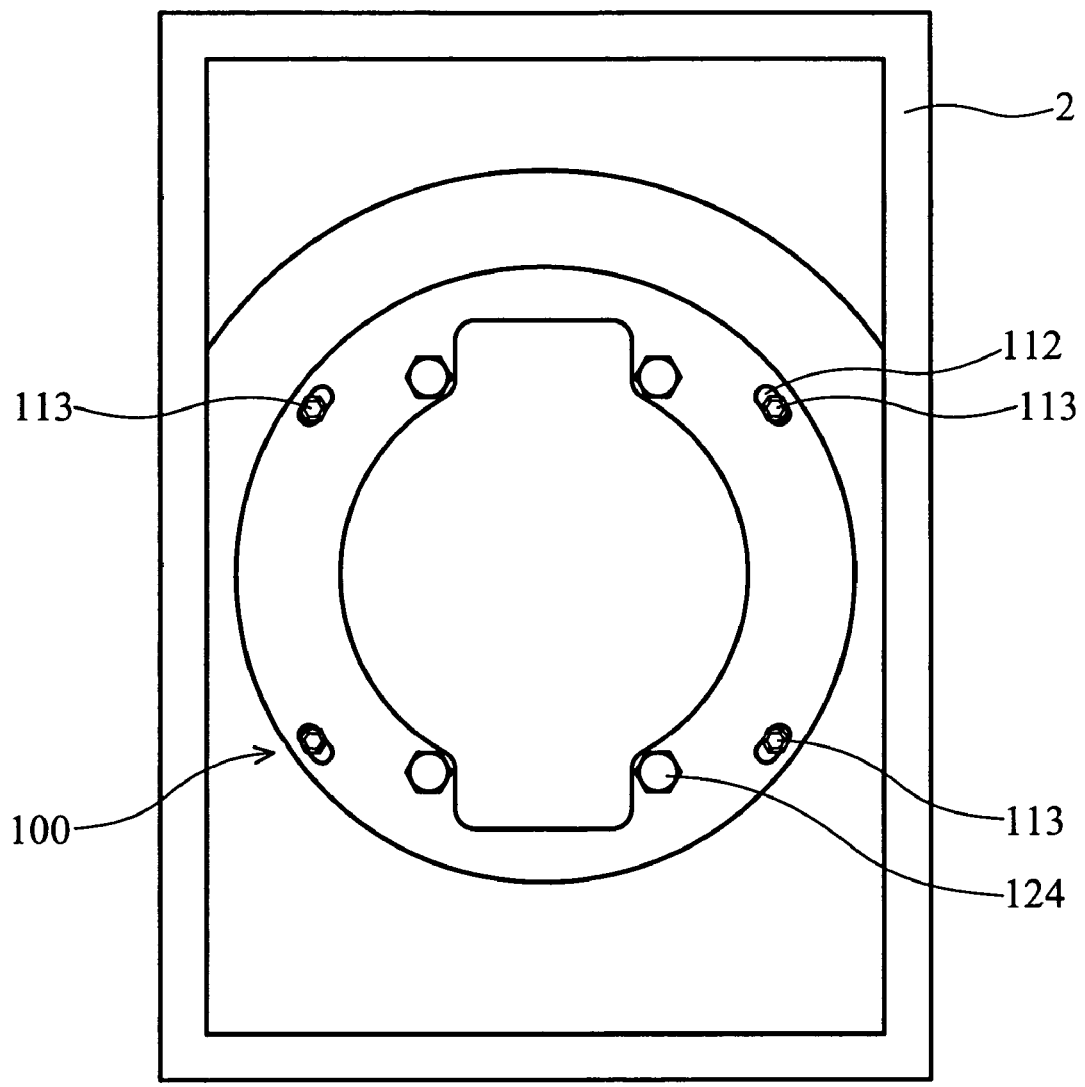
FIG. 1B is a schematic bottom view showing the disassembling device fitted on the electrostatic chuck assembly.
Figure 2:
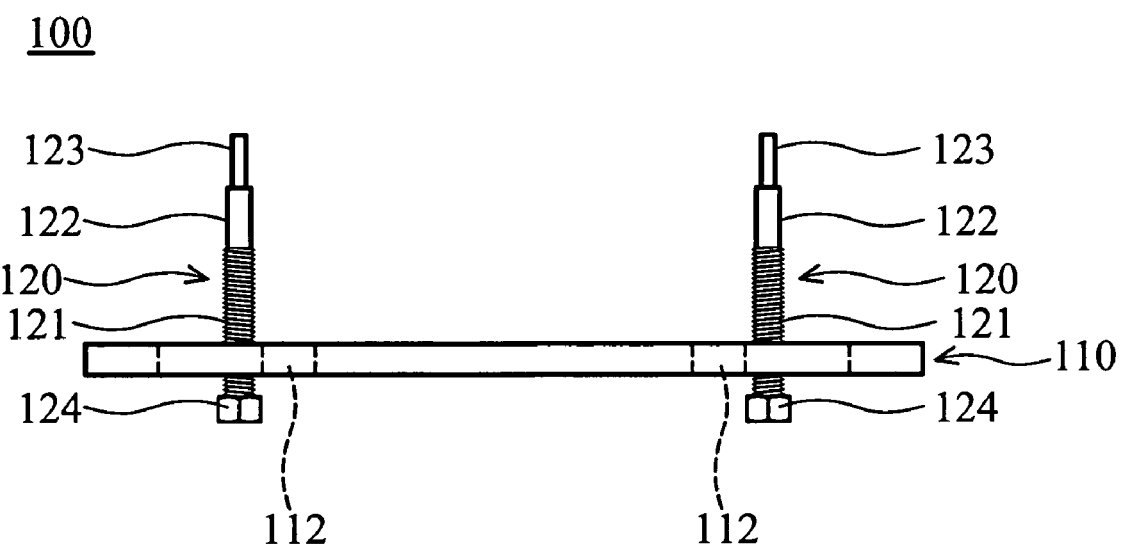
FIG. 2 is schematic side view showing the disassembling device of one embodiment of the invention.
Figure 3:
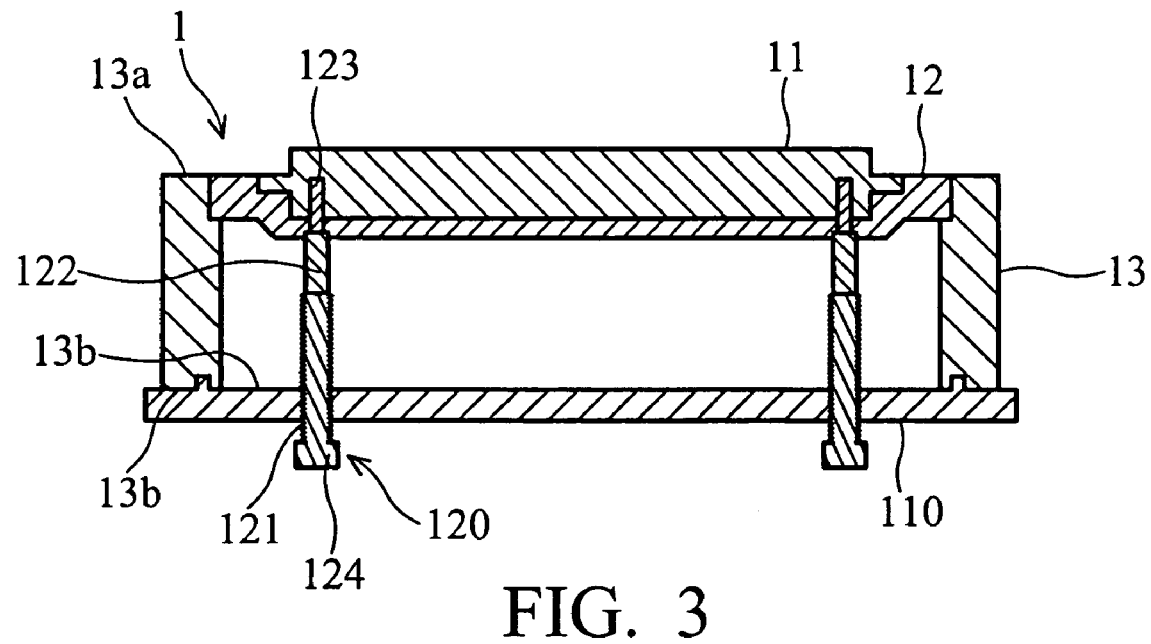
FIG. 3 is a schematic cross section showing the disassembling device fitted on the electrostatic chuck assembly.

Referring to FIG. 1B, FIG. 2 and FIG. 3, the disassembling device 100 is employed to separate the pedestal 11, ceramic element 12 and base 13 from the electrostatic chuck assembly 1. As shown in FIG. 3, the base 13 has a first end surface 13a and a second end surface 13b. The ceramic element 12 is disposed on the first end surface 13a. The pedestal 11 is disposed on the ceramic element 12. In this embodiment, elements in the electrostatic chuck assembly 1 except the pedestal 11, ceramic element 12 and base 13 are omitted to simplify the description.

Referring to FIG. 1B, FIG. 3, FIG. 5 and FIG. 6A, the disassembling device 100 comprises a main body 110 and four pushing elements 120. The main body 110 is disposed on the second end surface 13b and has four through holes ill. The pushing elements 120 penetrate the through holes 111 of the main body 110, respectively. The embodiment illustrated herein has been depicted as having four pushing elements 120. It should be appreciated, however, that fewer or more than four pushing elements 120 may be utilized.

Figure 5:
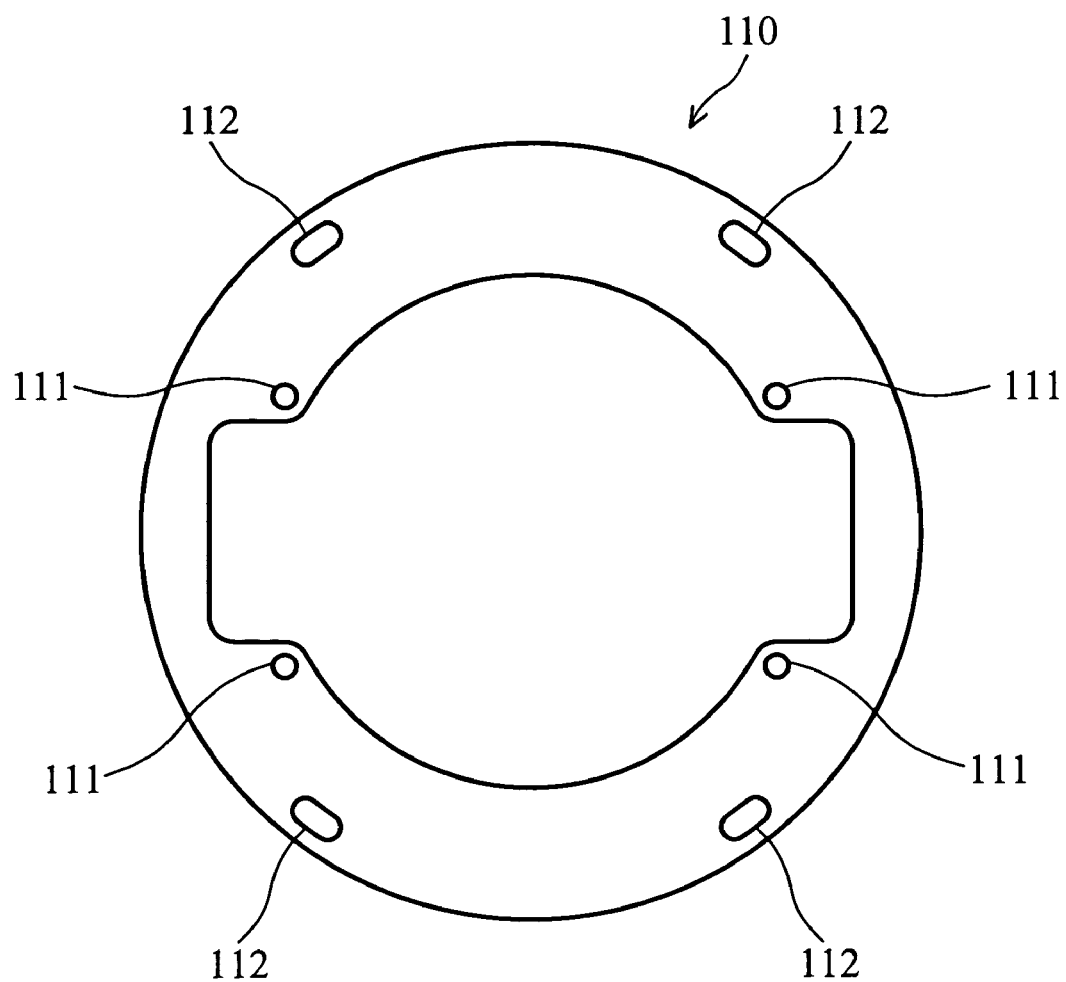
FIG. 5 is a schematic top view showing the main body of the disassembling device of one embodiment of the invention.

Additionally, four threaded holes (not shown) are formed on the second end surface 13b of the base 13. As shown in FIG. 5, four fixing holes 112 are formed on the main body 110 and correspond to the four threaded holes formed on the second end surface 13b of the base 13, respectively. The main body 110 can be fixed on the second end surface 13b of the base 13 by four bolts 113 fitted into the fixing holes 112 and threaded holes, as shown in FIG. 1B. Specifically, the fixing holes 112 may be formed as elongated slots having a substantially rectangular shape. When the main body 110 is fixed on the second end surface 13b of the base 13, the horizontal position of the main body 110 can be adjusted by changing the horizontal position of the bolts 113.

Figure 6A:
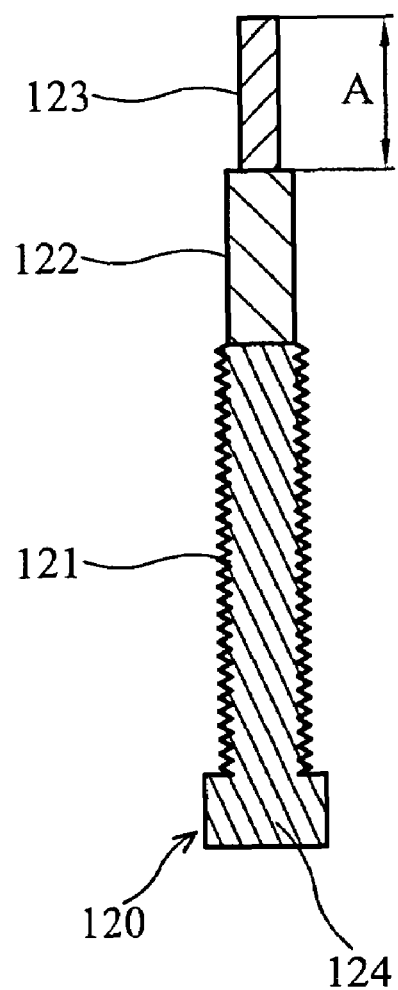
FIG. 6A is a schematic side view showing the pushing element of the disassembling device of one embodiment of the invention.

As shown in FIG. 2, FIG. 3 and FIG. 6A, each pushing element 120 has a second threaded portion 121, and each through hole 111 of the main body 110 has a first threaded portion (not shown). When the pushing element 120 penetrates the through hole 111, the second threaded portion 121 engages the first threaded portion such that the pushing element 120 can be rotated to gradually advance and/or withdraw within the through holes 111.

Figure 4:
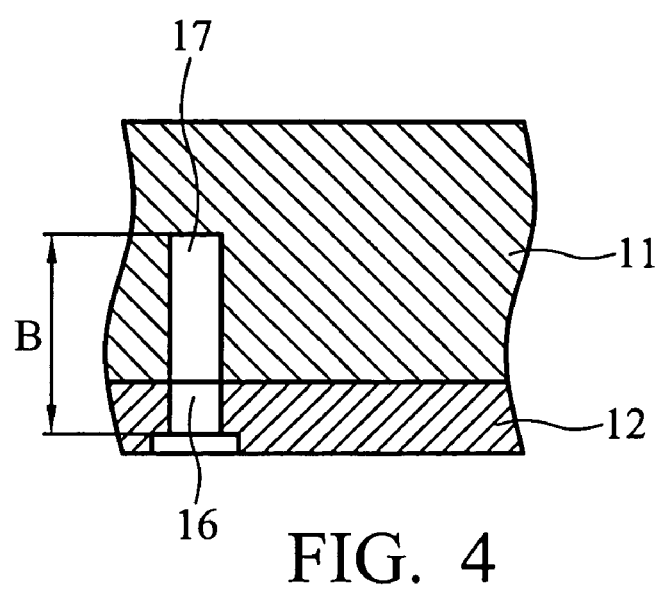
FIG. 4 is a schematic partial cross section according to FIG. 3.

As shown in FIG. 2, FIG. 3 and FIG. 6A, each pushing element 120 has a first retardant portion 122. The first retardant portion 122 is adjacent to the second threaded portion 121. Additionally, as shown in FIG. 4, the ceramic element 12 has four first retardant holes 16 corresponding to the pushing elements 120. The first retardant portion 122 of the pushing element 120 is engaged in the first retardant hole 16 of the ceramic element 12. Specifically, since the ceramic element 12 is made of ceramic material and brittle, the first retardant portion 122 of the pushing element 120 may be constructed of Teflon (or similar material) to protect the ceramic element 12 from damage due to pushing.

As shown in FIG. 2, FIG. 3 and FIG. 6A, each pushing element 120 has a second retardant portion 123. The second retardant portion 123 is adjacent to the first retardant portion 122. Additionally, as shown in FIG. 4, the pedestal 11 has four second retardant holes 17. The second retardant holes 17 align with the first retardant holes 16 of the ceramic element 12, respectively. The second retardant portion 123 of the pushing element 120 penetrates the first retardant hole 16 of the ceramic element 12 and insert into the second retardant hole 17 of the pedestal 11. The second retardant portion 123 may be made of metal.

Figure 6B:
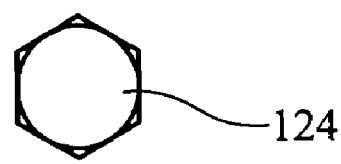
FIG. 6B is a schematic bottom view showing the pushing element of the disassembling device of one embodiment of the invention.

Moreover, as shown in FIG. 6A and FIG. 6B, each pushing element 120 has a head portion 124. The head portion 124 is adjacent to the second threaded portion 121. The pushing element 120 can be moved upward and downward in the main body 110 by rotating the head portion 124 with a tool or by hand.

Preferably, and as illustrated, the second threaded portion 121, first retardant portion 122, second retardant portion 123 and head portion 124 of the pushing element 120 are integrally formed.

The following description explains the operation of the disassembling device 100 in separating the pedestal 11, ceramic element 12 and base 13 from the electrostatic chuck assembly 1.

First, the main body 110 is placed on the second end surface 13b of the base 13. The position of the fixing holes 112 of the main body 110 align with that of the threaded holes on the second end surface 13b. Then, the four pushing elements 120 are fitted into the four through holes 111 of the main body 110, respectively.

The second threaded portion 121 of each pushing element 120 is engaged with the first threaded portion of each through hole 111 by rotating (with a tool) the head portion 124 of the pushing element 120. In this way, the pushing element 120 is moved toward the pedestal 11 and ceramic element 12. When the pushing element 120 continues to be moved toward the pedestal 11 and ceramic element 12, the second retardant portion 123 thereof penetrates the first retardant hole 16 of the ceramic element 12 to reach the second retardant hole 17 of the pedestal 11. As shown in FIG. 4 and FIG. 6A, because the length A of the second retardant portion 123 is slightly larger than the length B of the second retardant hole 17 and a part of the first retardant hole 16, the second retardant portion 123 of the pushing element 120 gently, but increasingly, pushes against the pedestal 11, and the pedestal 11 is gradually separated from the ceramic element 12. Further, the first retardant portion 122 of the pushing element 120 pushes against the ceramic element 12 and separates the ceramic element 12 from the base 13 completely. At this point in the procedure, the pedestal 11, ceramic element 12 and base 13 of the electrostatic chuck assembly 1 are completely separated. Thus, the interior of the pedestal 11 and ceramic element 12 can be cleaned or otherwise maintained, and the powder on the O-rings therein can be removed.

In conclusion, the disassembling device 100 of the invention has the following advantages. The cleaning or maintenance of the electrostatic chuck assembly is easily performed. The pedestal and ceramic element of the electrostatic chuck assembly are not damaged during disassembly. The cost of replaced elements is reduced. Since the operation for cleaning or maintaining the electrostatic chuck assembly is simplified, required time and manpower are reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic chuck assembly, comprising:
   a base having a first end surface and a second end surface;
   a ceramic element disposed on the first end surface and comprising a first retardant bole;
   a pedestal disposed on the ceramic element and comprising a second retardant hole adjacent to the first retardant hole;
   a main body disposed on the second end surface and comprising a through hole having a first threaded portion; and
   at least one pushing element capable of penetrating the through hole and pushing against the ceramic element and pedestal to separate the ceramic element and pedestal from the first end surface of the base, wherein the at least one pushing element comprises a second threaded portion, a first retardant portion and a second retardant portion, the first retardant portion is adjacent to the second threaded portion, the second retardant portion is adjacent to the first retardant portion, the second threaded portion rotatably engages the first threaded portion, the first retardant portion is engaged in the first retardant hole, and the second retardant portion penetrates the first retardant hole and is engaged in the second retardant hole.

2. The electrostatic chuck assembly as claimed in claim 1, wherein the second end surface of the base further comprises at least one threaded hole and the main body further comprises at least one fixing hole, the main body fixed onto the second end surface of the base by fixing a bolt into the fixing hole and the threaded hole.

3. The electrostatic chuck assembly as claimed in claim 2, wherein the fixing hole is an elongated slot.

4. The electrostatic chuck assembly as claimed in claim 2, wherein the fixing hole is substantially rectangular.

5. The electrostatic chuck assembly as claimed in claim 1, wherein the first retardant portion of the at least one pushing element is composed of Teflon.

6. The electrostatic chuck assembly as claimed in claim 1, wherein the second retardant portion is composed of metal.

7. The electrostatic chuck assembly as claimed in claim 1, wherein the at least one pushing element further comprises a head portion adjacent to the first threaded portion.

8. The electrostatic chuck assembly as claimed in claim 7, wherein the first threaded portion, first retardant portion, second retardant portion and head portion of the at least one pushing element are integrally formed.

9. A disassembling device for separating a first object from a second object and a third object, the first object having a first end surface and a second end surface, the second object disposed on the first end surface of the first object and having a first retardant hole, the third object disposed on the second object and having a second retardant hole adjacent to the first retardant hole, the disassembling device comprising:
   a main body disposed on the second end surface and comprising a through hole having a first threaded portion; and
   at least one pushing element capable of penetrating the through hole and pushing against the second and third objects to separate the second and third objects from the first end surface of the first object, wherein the at least one pushing element comprises a second threaded portion, a first retardant portion and a second retardant portion adjacent to the first retardant portion, the second threaded portion engages the first threaded portion, the first retardant portion is adjacent to the second threaded portion and engaged in the first retardant hole, and the second retardant portion penetrates the first retardant hole and is engaged in the second retardant hole.

10. The disassembling device as claimed in claim 9, wherein the second end surface of the first object further comprises at least one threaded hole and the main body further comprises at least one fixing hole, the main body fixed Onto the second end surface of the first object by fixing a bolt into the fixing hole and threaded hole.

11. The disassembling device as claimed in claim 10, wherein the fixing hole is an elongated slot.

12. The disassembling device as claimed in claim 10, wherein the fixing hole is substantially rectangular.

13. The disassembling device as claimed in claim 9, wherein the first retardant portion of the at least one pushing element is composed of Teflon.

14. The disassembling device as claimed in claim 9, wherein the second retardant portion is made of metal.

15. The disassembling device as claimed in claim 9, wherein the at least one pushing element further comprises a head portion adjacent the first threaded portion.

16. The disassembling device as claimed in claim 15, wherein the first threaded portion, first retardant portion, second retardant portion and head portion of the at least one pushing element are integrally formed.

* * * * *